(12) United States Patent
Clevenger et al.

(10) Patent No.: US 9,171,800 B2
(45) Date of Patent: Oct. 27, 2015

(54) ELECTRICAL FUSE WITH BOTTOM CONTACTS

(71) Applicant: International Business Machines Corporation, Armonk, NY (US)

(72) Inventors: Lawrence A. Clevenger, LaGrangeville, NY (US); Zhengwen Li, Scarsdale, NY (US); Dan Moy, Bethel, CT (US); Viraj Y. Sardesai, Poughkeepsie, NY (US); Keith H. Tabakman, Newburgh, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 77 days.

(21) Appl. No.: 14/195,952

(22) Filed: Mar. 4, 2014

(65) Prior Publication Data
US 2015/0255393 A1    Sep. 10, 2015

(51) Int. Cl.
| | |
|---|---|
| H01L 21/44 | (2006.01) |
| H01L 23/52 | (2006.01) |
| H01L 23/525 | (2006.01) |
| H01L 27/112 | (2006.01) |
| H01L 29/417 | (2006.01) |
| H01L 29/40 | (2006.01) |

(52) U.S. Cl.
CPC ...... *H01L 23/5256* (2013.01); *H01L 27/11206* (2013.01); *H01L 29/408* (2013.01); *H01L 29/4175* (2013.01)

(58) Field of Classification Search
CPC .................................................. H01L 23/5256
USPC ................. 438/601, 467, 333, 281, 215, 132; 257/209, 529–530, 665
See application file for complete search history.

(56) References Cited

U.S. PATENT DOCUMENTS

| 6,356,496 B1 * | 3/2002 | Carroll et al. ............. 365/225.7 |
| 2010/0090751 A1 * | 4/2010 | Cheng et al. .................. 327/525 |
| 2012/0223802 A1 | 9/2012 | Shin et al. |

FOREIGN PATENT DOCUMENTS

JP    2010245102 A    10/2010

OTHER PUBLICATIONS

Pai et al., "Integrated W-Silicide Metal Resistor for Advanced CMOS Technologies", 2001 IEEE, pp. 216-218.
Tonti, "Reliability, Design Qualification, and Prognostic Opportunity of in Die E-Fuse", 2011 IEEE.

* cited by examiner

*Primary Examiner* — Calvin Lee
(74) *Attorney, Agent, or Firm* — Catherine Ivers; Hoffman Warnick LLC

(57) ABSTRACT

A method including forming a fuse link after a first fuse contact and a second fuse contact. The fuse link is in direct contact with both the first fuse contact and the second fuse contact. Embodiments of the invention provide an e-fuse that is capable of being connected to a device either through back end of line or by a long contact allowing for sufficient separation between the e-fuse and the device.

16 Claims, 8 Drawing Sheets

ELECTRICAL FUSE WITH BOTTOM CONTACTS

BACKGROUND

The present invention generally relates to semiconductor device manufacturing, and more particularly to a technique of fabricating an electrical fuse (hereinafter "e-fuse") with a bottom contact in a middle of line (hereinafter "MOL") of a semiconductor structure.

An e-fuse is a structure that is blown in accordance with a suitable electrical current. For example, an electrical current is provided through the e-fuse to eventually cause the e-fuse to blow and create an open circuit. Programming refers to intentionally blowing an e-fuse and creating the open circuit. In integrated circuitry memory devices, e-fuses can be used for activating redundancy in memory chips and for programming functions and codes in logic chips. Specifically, dynamic random access memory (DRAM) and static random access memory (SRAM) may employ e-fuses for such purposes.

E-fuses can also be used to prevent decreased chip yield caused by random defects generated in the manufacturing process. Moreover, e-fuses provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

SUMMARY

According to one exemplary embodiment of the present invention, a method of forming an e-fuse in a semiconductor is provided. The method may include forming a first fuse contact on a substrate, a second fuse contact on the substrate, a device contact on a substrate, and a fuse link, wherein the fuse link is electrically connecting the first fuse contact and the second fuse contact. Additionally, a first metal via is electrically connected to the first fuse contact, and a second metal via is electrically connected to the second fuse contact. Wherein, the first metal via and the second metal via are only electrically connected to the fuse link through the first fuse contact and the second fuse contact, respectively.

According to another exemplary embodiment of the present invention, a structure of an e-fuse in a semiconductor is provided. The structure may include forming a first fuse contact on a substrate, a shared contact on the substrate, and a fuse link, wherein the fuse link is electrically connecting the first fuse contact and the second fuse contact. The shared contact is in electrical connection with the fuse link and a source-drain region of a transistor or other device acting as both a fuse contact and a device contact. Additionally, a first metal via is electrically connected to the first fuse contact.

According to another exemplary embodiment of the present invention, a structure is provided. The structure may include forming a first fuse contact, a second fuse contact, and a fuse link, wherein the fuse link is electrically connecting the first fuse contact and the second fuse contact. Additionally, a first metal via is electrically connected to the first fuse contact, and a second metal via is electrically connected to the second fuse contact. Wherein, the first metal via and the second metal via are electrically connected to the fuse link through the first fuse contact and the second fuse contact, respectively.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
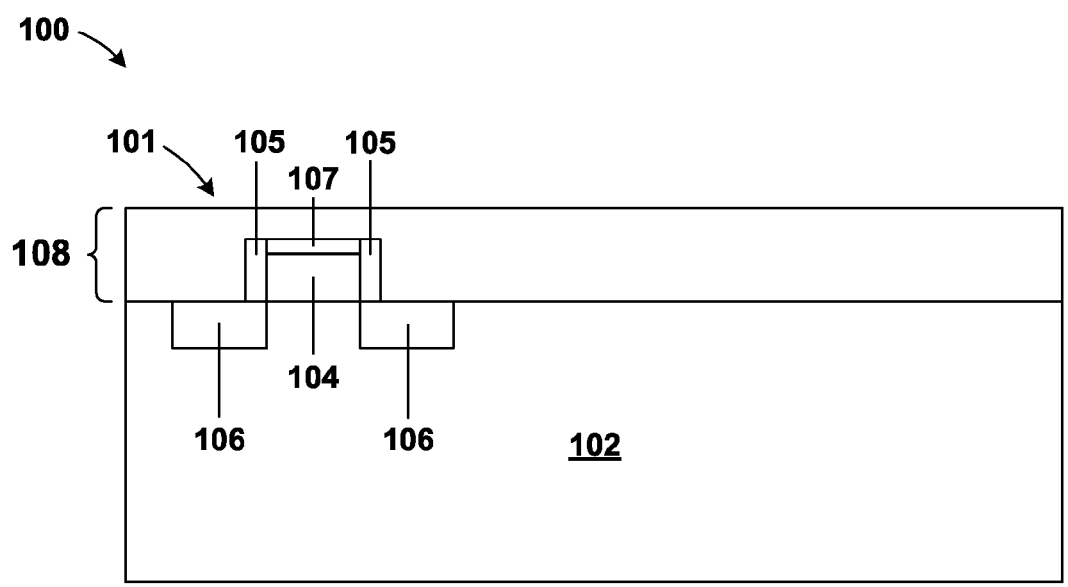
FIG. 1 is a cross section view of a semiconductor structure according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to a technique of fabricating an e-fuse with a bottom contact in the middle of line MOL of a semiconductor structure. It should be noted that the e-fuse as described above may also function or be referred to as a resistor.

Ideally, it may be desirable to fabricate an e-fuse in the MOL region of a semiconductor structure without contaminating an underlying or adjacent semiconductor device. One way to fabricate an e-fuse in the MOL region of a semiconductor structure without contaminating an underlying or adjacent semiconductor device is to form the e-fuse with one or more bottom contacts prior to fabricating a fuse link. One embodiment by which to fabricate an e-fuse with bottom contacts in the MOL region is described in detail below by referring to the accompanying drawings FIGS. 1-9. In a preferred embodiment, the bottom contacts may be formed at the same time, at the same level, and of the same material as a device contact.

FIG. 1 is a demonstrative illustration of a structure 100 during an intermediate step of a method of fabricating an e-fuse with bottom contacts according to an embodiment. More specifically, the method can start with fabricating a semiconductor device 101 (hereinafter "device") on a substrate 102 according to techniques well known in the art.

The substrate 102 can include; a bulk semiconductor (as illustrated in the figures), a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors.

In an embodiment, the device 101 may be a transistor which may include a gate 104, a pair of dielectric spacers 105, and a gate cap 107. The device can be fabricated according to techniques well known in the art including, for example, gate first or gate last techniques (i.e. replacement gate). The device 101 may include either a planar structure or a fin structure as is well known in the art. A planar device is illustrated in the figures and relied on for purposes of this description. The gate 104 may be formed on top of the substrate 102 using known materials and configurations. The pair of dielectric spacers 105 may be formed, for example, by depositing a dielectric followed by an anisotropic etch that removes the dielectric from the horizontal surfaces of the structure 100 while leaving it on opposite sidewalls of the gate 104. The device 101 may also include a source-drain region 106 formed in the substrate 102 using any technique known in the art. The source-drain region 106 may be formed from doped wells as is well known in the art, for example, ion implantation. The source-drain region 106 may extend beneath the pair of dielectric spacers 105, as illustrated. In some cases, the source-drain region 106 may extend further beneath a portion of the gate 104. In some additional cases, the source-drain region 106 may not reach the dielectric spacers 105. Alternatively, in an embodiment, the source-drain region 106 may be raised above the substrate 102. The gate cap 107 may be formed from on top of the gate 104 and of materials such as, for example, TiN, W, Ti, Al, Ta, TaN, Co, and Ni. The gate cap 107 may be formed using any technique well known in the art.

The structure 100 may also include an isolation structure situated between two adjacent devices to electrically insulate them from one another. For example, a shallow trench isolation structure may be formed in the substrate 102 between two adjacent devices. The shallow trench isolation structure may include a trench filled with a dielectric material.

With continued reference to FIG. 1, a first inter-level dielectric 108 (hereinafter "first ILD") may be deposited on top of the structure 100. The first ILD 108 may include any of several dielectric materials, for example, oxides, nitrides and oxynitrides of silicon. Alternatively, the first ILD 108 may also include oxides, nitrides and oxynitrides of elements other than silicon. In an embodiment, the first ILD 108 may include an oxide deposited using a CVD deposition technique. The first ILD 108 may have a thickness ranging from about 25 nm to about 200 nm. The first ILD 108 may be planarized using a chemical-mechanical polishing technique after being formed on top of the structure 100.

Figure 2:
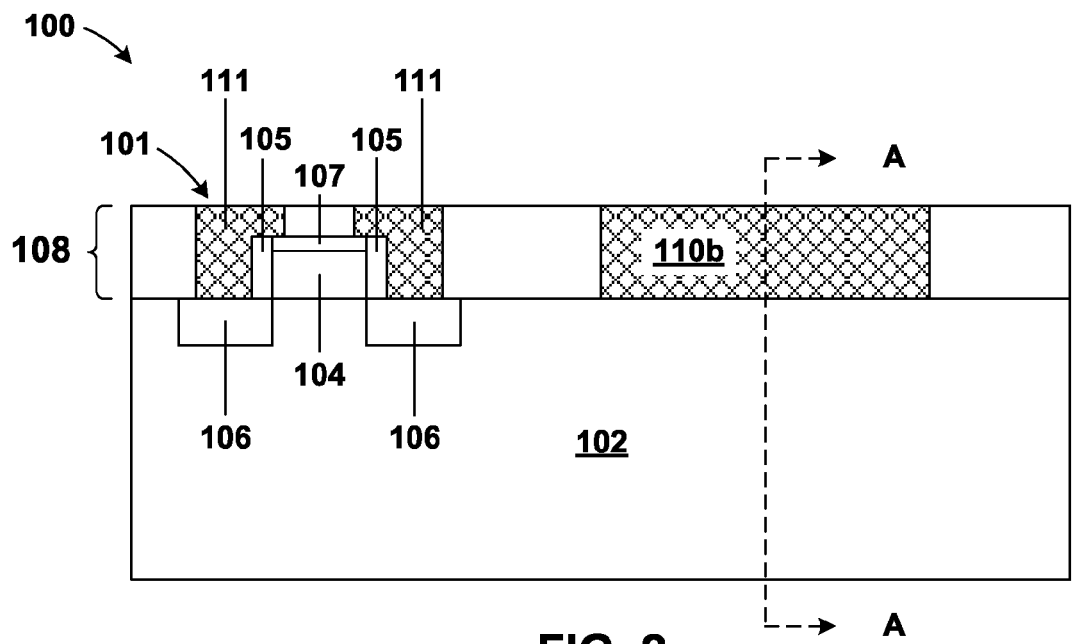
FIG. 2 is a cross section view of the structure and illustrates forming one or more device contacts and one or more fuse contacts.
Figure 3:
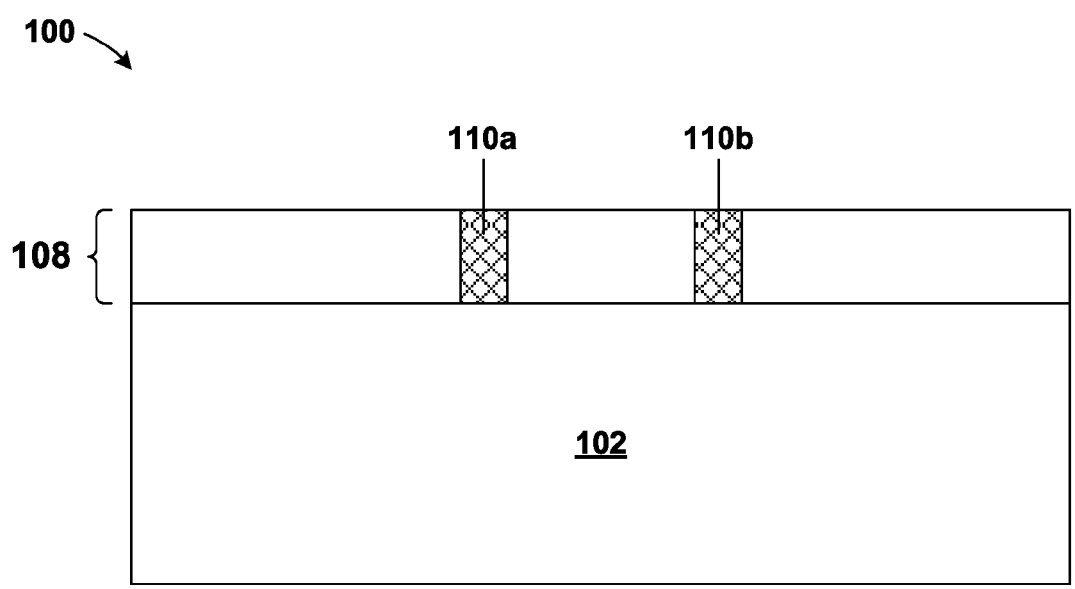
FIG. 3 is a cross section view of FIG. 2, taken along section line A-A.

FIGS. 2 and 3 are demonstrative illustrations of the structure 100 during an intermediate step of a method of fabricating the e-fuse with bottom contacts according to an embodiment. More specifically, the method can include forming one or more device contacts 111, a first fuse contact 110a, and a second fuse contact 110b. FIG. 3 is a cross section view of FIG. 2 taken along section line A-A. In the present embodiment, the device contacts 111 may be self-aligned to the gate 104 according to known techniques.

First, contact openings may be formed in the first ILD 108 using any technique known in the art. Some contact openings may be formed above the device 101 in preparation for forming the device contacts 111, and some contact openings may be formed adjacent to the device in preparation for forming the first fuse contact 110a and the second fuse contact 110b. The contact openings for the device contacts 111 may preferably expose the source-drain regions 106, whereas the contact openings for the first fuse contact 110a and the second fuse contact 110b may not expose any particular element of the device. The contact openings may be formed using, for example, lithography followed by an etching technique such as, dry etch, wet etch, or a combination of both. The contact openings may be holes or trenches as is well known in the art. As a result of their self-aligned orientation, the contact openings for the device contacts 111 may expose the pair of dielectric spacers 105 and the gate cap 107 in addition to the source-drain regions 106.

Next, the contact openings may be filled with a conductive material to form the device contacts 111, the first fuse contact 110a, and the second fuse contact 110b. The device contacts 111, the first fuse contact 110a, and the second fuse contact 110b may include any electrically conductive material. For example, the device contact 111, the first fuse contact 110a, and the second fuse contact 110*b* may include; tungsten, aluminum, silver, gold, alloys thereof, and any suitable combination thereof. The conductive material can be deposited in the contact openings by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The height, or depth, of the device contact 111, the first fuse contact 110*a*, and the second fuse contact 110*b* may range from about 25 nm to about 200 nm, although lesser and greater thicknesses may also be used. It should be noted, that the height of the contact may be substantially equal to the thickness of the first ILD 108. After deposition, a planarization process such as CMP may be performed to remove any excess conductive material from above the first ILD 108. An upper surface of the first ILD 108 may undergo an optional pre-cleaning technique in preparation for subsequent processing. The first fuse contact 110*a* and the second fuse contact 110*b*, as opposed to typical contacts, will have a length greater than a width. That way, the future fuse link and metal via may land on different positions on the fuse contacts.

With continued reference to FIGS. 2 and 3, the device contacts 111, the first fuse contact 110*a*, and the second fuse contact 110*b* may be simultaneously formed at the same level and of the same material. As illustrated, the device contacts 111 may be self-aligned to the gate 104. It should be noted that the formation of self-aligned device contacts, for example the device contacts 111, may result in the contact overlapping and contacting an upper portion of the gate cap 107. More specifically, the conductive material of the device contacts 111 may be in direct contact with the pair of dielectric spacers 105 and the gate cap 107.

Figure 4:
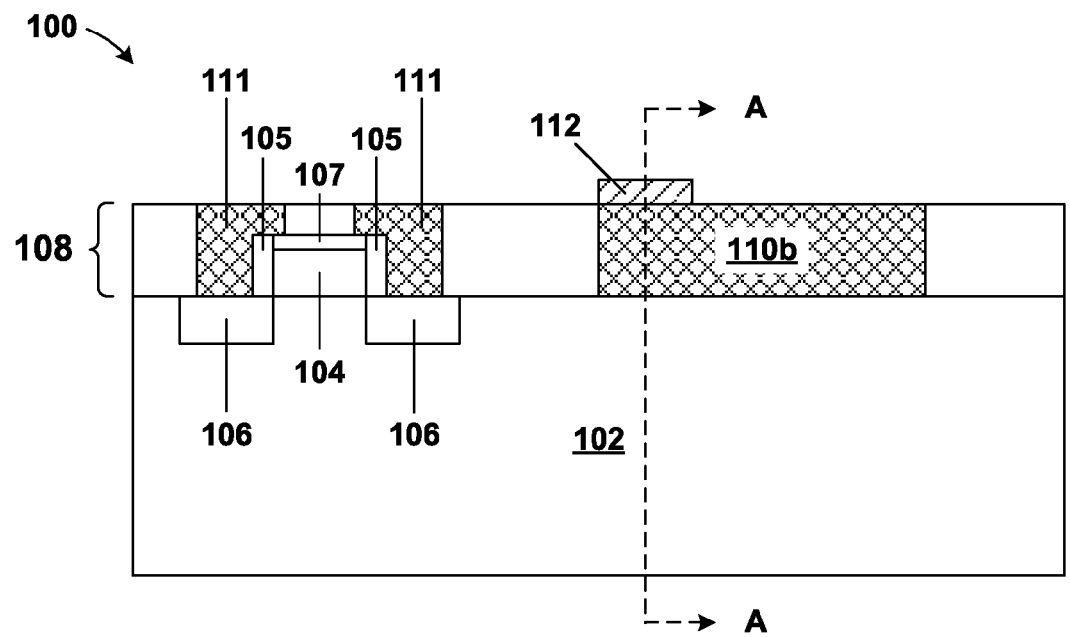
FIG. 4 is a cross section view of the structure and illustrates forming of a fuse link.
Figure 5:
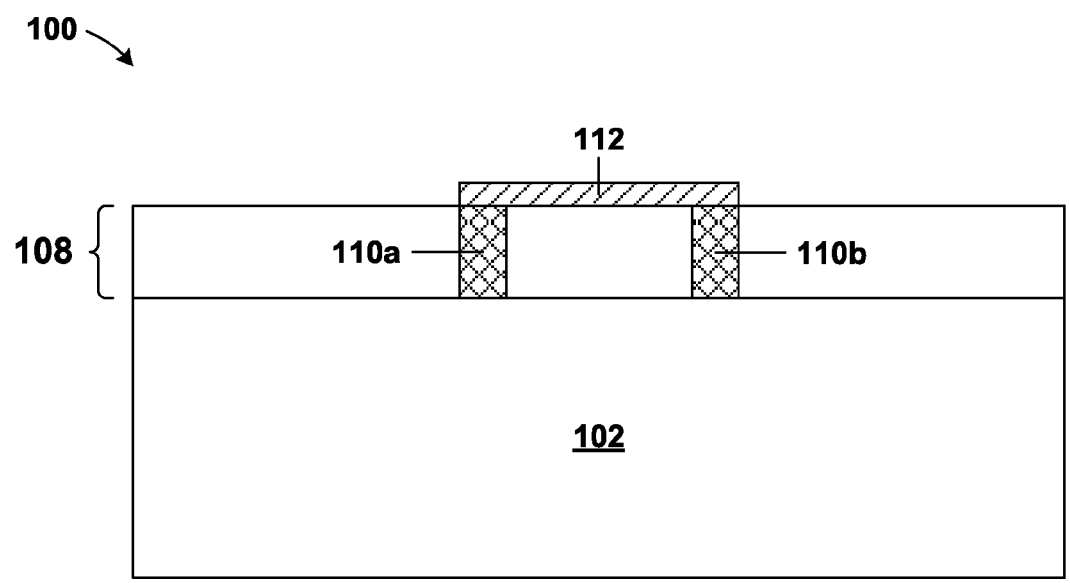
FIG. 5 is a cross section view of FIG. 4, taken along section line A-A.

FIGS. 4 and 5 are demonstrative illustrations of the structure 100 during an intermediate step of a method of fabricating an e-fuse with bottom contacts according to one embodiment. More specifically, a fuse link 112 may be formed above the first fuse contact 110*a* and above the second fuse contact 110*b*. FIG. 5 is a cross section view of FIG. 4 taken along section line A-A.

The fuse link 112 may be formed using any technique known in the art such as, for example, a subtractive etch technique or a damascene technique. The subtractive etch technique is illustrated in the figures and described below.

First, a blanket metal-silicide layer may be deposited above the structure 100. The metal-silicide layer may be deposited using conventional deposition methods, for example, chemical vapor deposition, low-pressure chemical vapor deposition, atomic layer deposition, or physical vapor deposition. The metal-silicide layer may include any metal-silicide, such as, for example, tungsten silicide.

Next, a photoresist material may be subsequently deposited above the metal-silicide layer and then lithographically patterned to form a mask. The photoresist material may be patterned by exposing it to a desired pattern of radiation and developing the exposed photoresist utilizing a conventional resist developer. The mask or pattern in the photoresist may then be transferred to the metal-silicide layer using one or more dry etching techniques. Suitable dry etching techniques may include, but are not limited to: reactive ion etching (RIE), ion beam etching, plasma etching, or laser ablation. In one embodiment, a RIE technique using, for example, a chlorine based etchant including $BCL_3$, $CHCL_3$, or $CL_2$, may be used to transfer the mask pattern into the fuse link metal layer and thus form the fuse link 112. The mask may then be removed by resist stripping after etching has been completed. The mask may include well known photoresist materials, such as, for example, a soft mask, and could be either positive or negative in tone. Optionally, a non-contact or a hardmask may be used.

Figure 10:
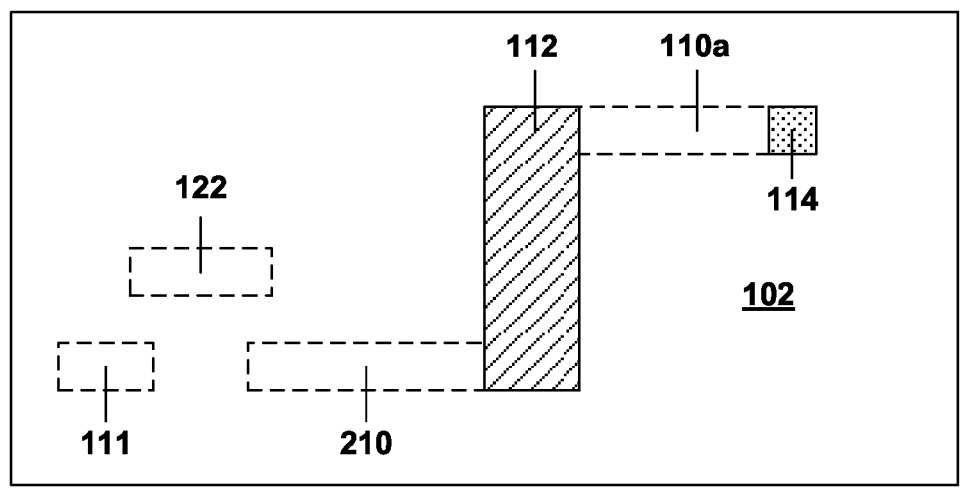
FIG. 10 is a top view of FIG. 8 and FIG. 9.
Figure 11:
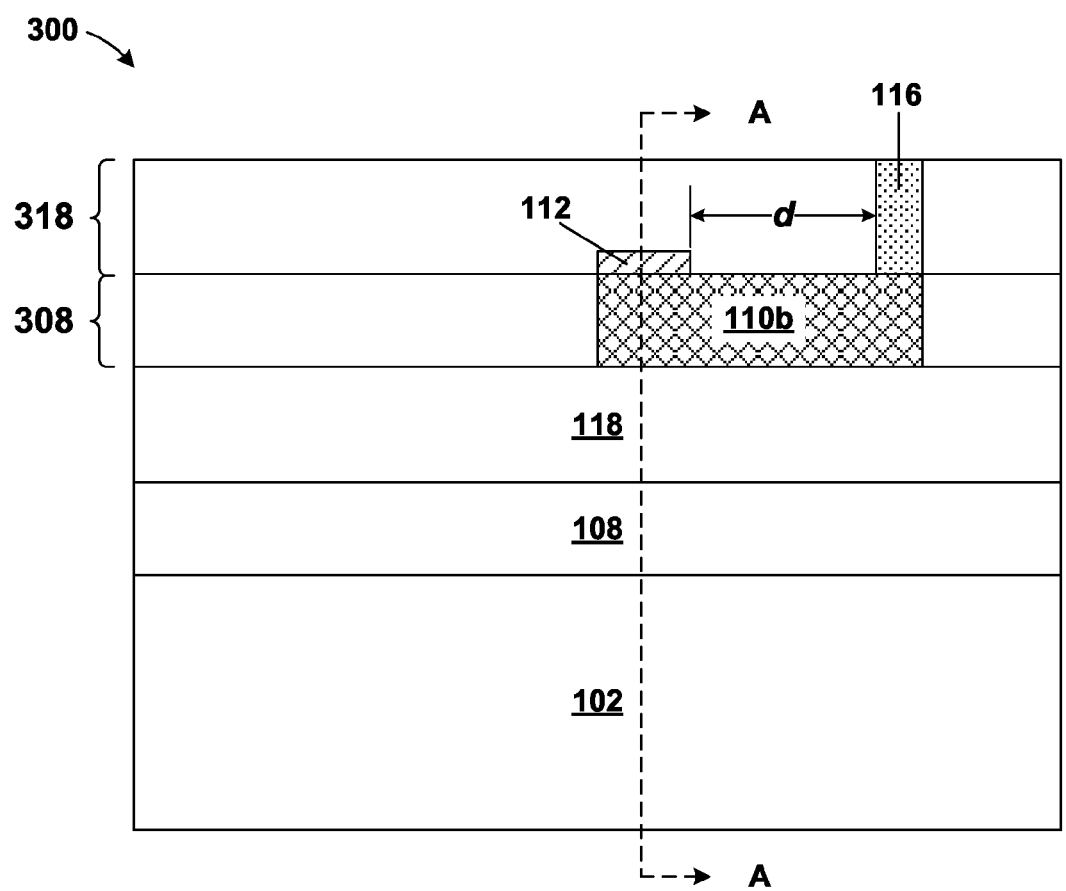
FIG. 11 is a cross section view of the final structure at according to an alternative embodiment.
Figure 12:
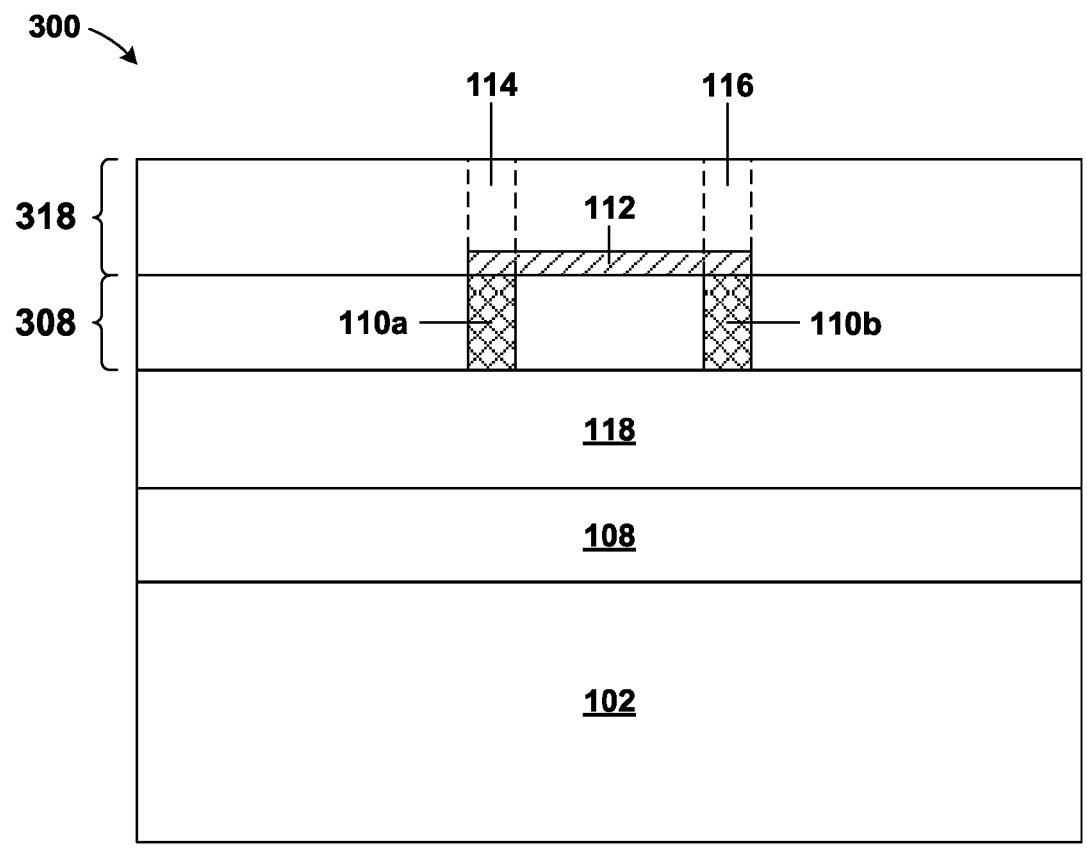
FIG. 12 is a cross section view of FIG. 11, taken along section line A-A.

The fuse link 112 may form an electrically conductive path between the first fuse contact 110*a* and the second fuse contact 110*b*. In the present example, the fuse link 112 may be formed on top of, and in direct contact with, both the first fuse contact 110*a* and the second fuse contact 110*b*. The fuse link 112 may contact any portion of the first fuse contact 110*a* and any portion of the second fuse contact 110*b*. In the present embodiment, as illustrated in FIGS. 4 and 5, the fuse link 112 may be positioned at the same end of both the first fuse contact 110*a* and the second fuse contact 110*b*. In an alternative embodiment, the fuse link 112 may contact opposite ends of the first fuse contact 110*a* and the second fuse contact 110*b*, as illustrated in FIGS. 10, 11, and 12. The fuse link 112 may have cross sectional dimensions suitable for operation as either an e-fuse or a resistor.

In an alternative embodiment, the fuse link 112 may be fabricated using a damascene technique as referenced above. Fabrication of the fuse link 112 using a damascene technique can result in a slightly different configuration. In such cases, an additional dielectric layer may be first deposited above the structure 100, followed by patterning an opening trench in the dielectric. The metal-silicide layer may then be deposited within the opening. In the present embodiment, it should be noted that the thickness of the dielectric may be greater than the desired thickness of the fuse link 112. As such, the fuse link 112 may be conformally deposited along the bottom and the sidewalls of the opening. The remaining opening above the fuse link will be backfilled with additional inter-level dielectric and then planarized.

It should be noted that in all cases the first fuse contact 110*a* and the second fuse contact 110*b* may be fabricated before fabricating the fuse link 112 to eliminate a number of deficiencies, for example, potential contamination of an underlying device, and topographical contact patterning issues. Traditionally, a fuse contact in the MOL may be fabricated to intersect a preexisting metal-silicide fuse link. Such techniques may risk contaminating an underlying or adjacent semiconductor device with the metal-silicide material during etching of a contact opening which intersects the metal-silicide fuse link. Additionally, the present embodiment may reduce or eliminate contact patterning complications created by topographical variations due to the presence of the fuse link prior to contact patterning. Traditionally, multiple contact patterning steps were required to account for variations in topography cause by the presence of the fuse link. More specifically, the device contacts and the fuse contacts were unable to be formed during the same contact patterning step due to the variations in topography. According to the present embodiment, the first fuse contact 110*a* and the second fuse contact 110*b* may be patterned simultaneously with the device contacts 111 in a single contact patterning step.

Furthermore, according to another embodiment, the above techniques may allow for an e-fuse to be formed at a distance from the device 101 which can decrease any effect a fuse will have on a device, such as, for example, high temperatures due to current passing through the e-fuse.

Figure 6:
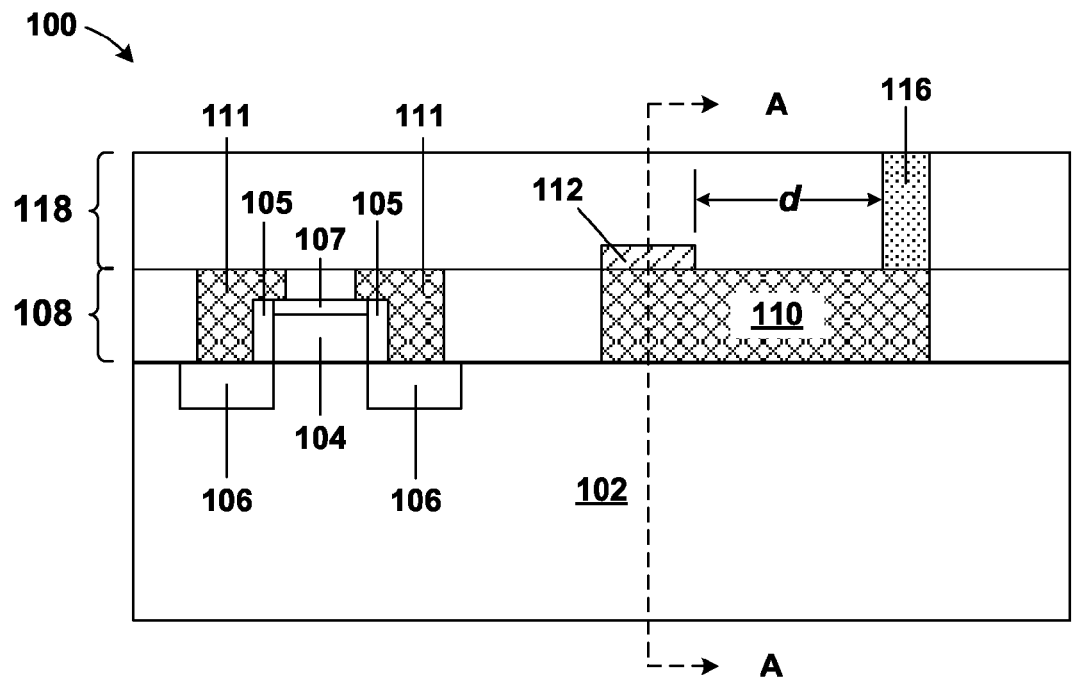
FIG. 6 is a cross section view of the structure and illustrates forming of a first metal via and a second metal via.
Figure 7:
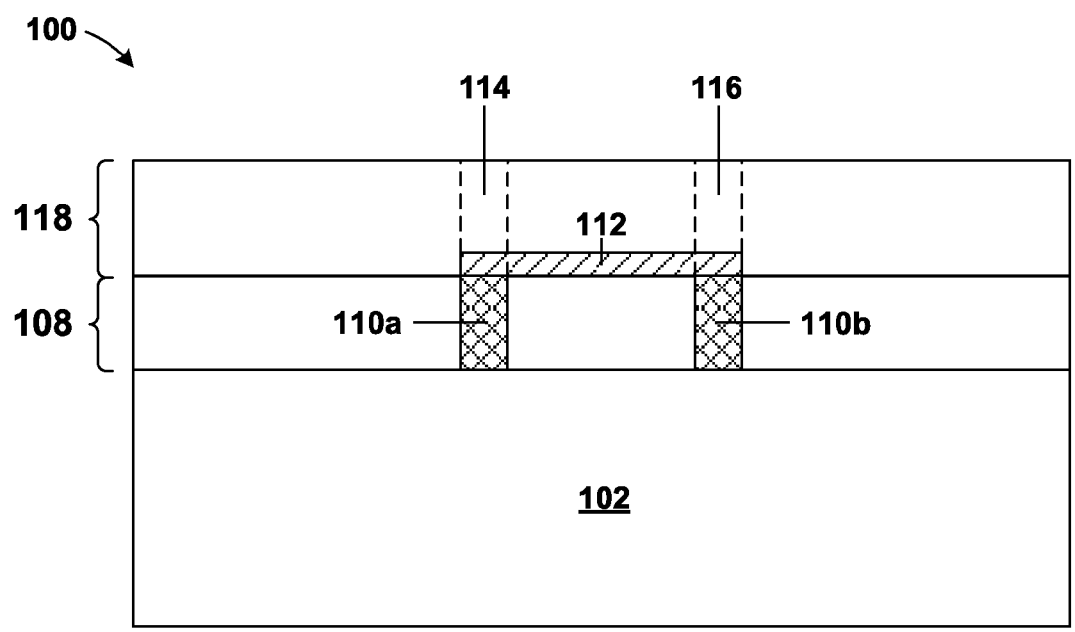
FIG. 7 is a cross section view of FIG. 6, taken along section line A-A.

FIGS. 6 and 7 are demonstrative illustrations of the structure 100 during an intermediate step of a method of fabricating an e-fuse with bottom contacts according to an embodiment. More specifically, a first metal via 114 and a second metal via 116 may be formed above the first fuse contact 110a and the second fuse contact 110b. FIG. 7 is a cross section view of FIG. 6 taken along section line A-A.

First, a second inter-level dielectric layer 118 (hereinafter "second ILD") may be deposited on top of the structure 100. The second ILD 118 may be substantially similar to the first ILD 108. The second ILD 118 may have a thickness ranging from about 10 nm to about 100 nm.

More specifically, the first metal via 114 and the second metal via 116 may be fabricated in the second ILD 118 using techniques well known in the art. For example, a damascene technique involving patterning a mask, etching a via opening, and filling the via opening with a conductive material may be used. In the present example, a mask may be deposited above the second ILD 118 and subsequently patterned using known lithography techniques. The via opening corresponding to the patterned mask may then be etched into the second ILD 118. A person having ordinary skill in the art will recognize that in various embodiments, the via opening may be any shape, such as, for example, a circular opening or a trench. Finally, the via opening may be filled with a conductive material, such as, for example, copper. The conductive material used to fabricated the first metal via 114 and the second metal via 116 can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The height, or depth, of the first metal via 114 and the second metal via 116, may range from about 5 nm to about 100 nm, although lesser and greater thicknesses may also be used. After deposition, a planarization process such as CMP may be performed to remove any excess conductive material from above the second ILD 118. For example, the first metal via 114 can be separated from the fuse link 112 by a distance (d) to control electromigration. It should be noted that the first metal via 114 may be in direct contact with the first fuse contact 110a, and the first fuse contact 110a may form an electrical connection between the first metal via 114 and the fuse link 112. Similarly, the second metal via 116 can be separated from the fuse link 112 by a distance (d) to control electromigration. The second metal via 116 may be in direct contact with the second fuse contact 110b, and the second fuse contact 110b may form an electrical connection between the second metal via 116 and the fuse link 112.

It should be noted that in FIG. 7 the first metal via 114 and the second metal via 116 are shown as dotted lines to illustrate the fact that the first metal via 114 and the second metal via 116 are in different planes than the fuse link 112.

Figure 8:
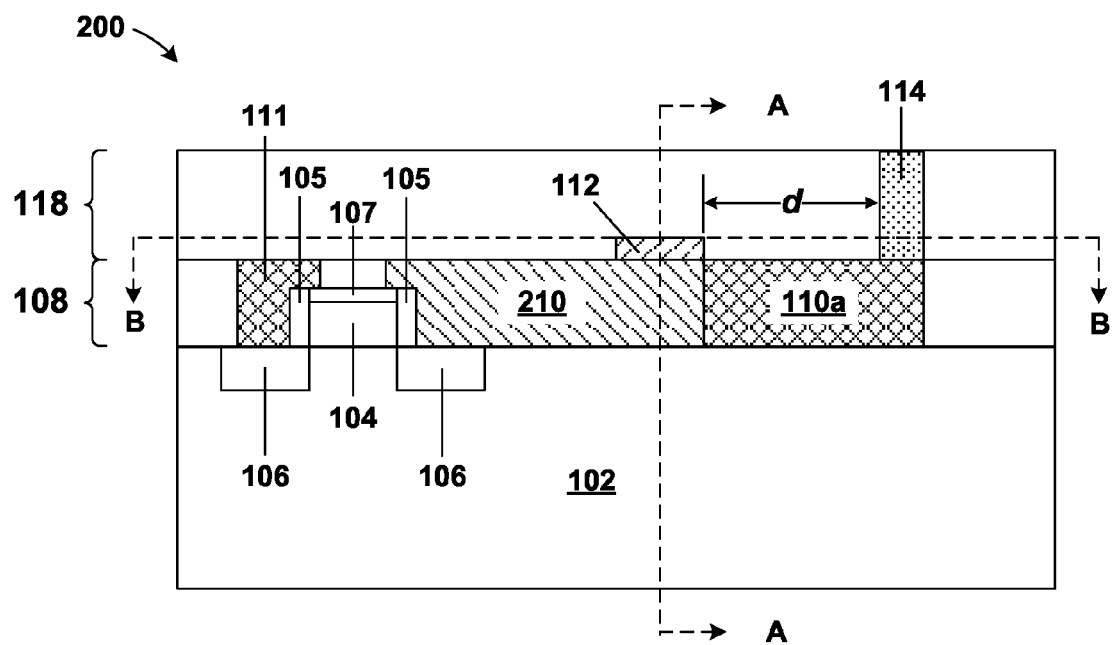
FIG. 8 is a cross section view of the final structure according to an alternative embodiment.
Figure 9:
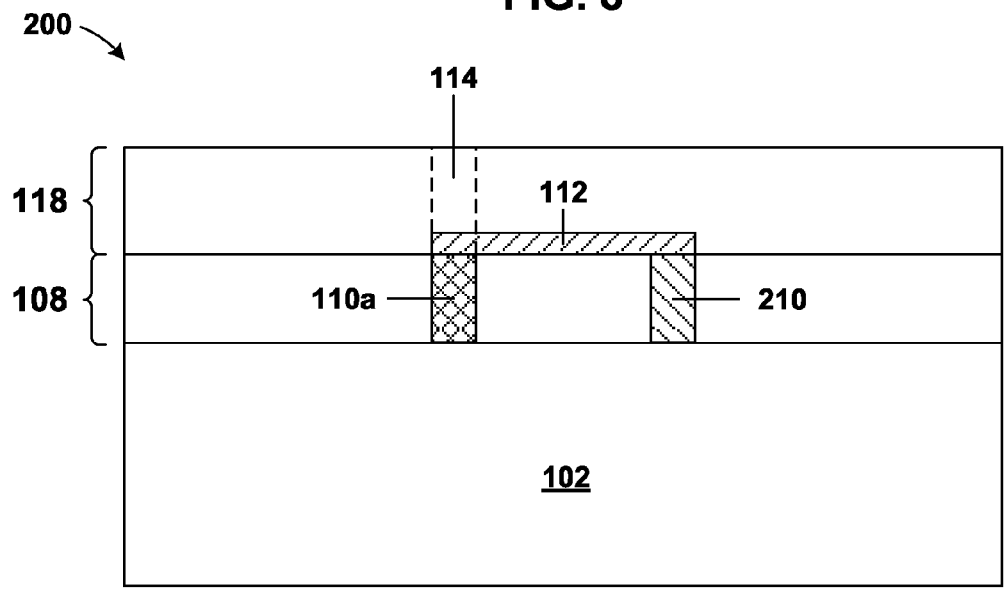
FIG. 9 is a cross section view of FIG. 8, taken along section line A-A.

FIGS. 8, 9 and 10 are demonstrative illustrations of a structure 200 according to an alternative embodiment. More specifically, a single contact may be used to electrically connect an e-fuse to a device. FIG. 9 is a cross section view of FIG. 8 taken along section line A-A, and FIG. 10 is a cross section view of FIG. 8 taken along section line B-B.

A single contact may be fabricated to function as both a device contact and a fuse contact 210 (hereinafter "shared contact"). According to the present embodiment, the shared contact 210 can be simultaneously formed at the same level and of the same material as the fuse contact 110a and device contact 111. The shared contact 210 will create a direct connection between the fuse link 112 and the source/drain region 106 of the device 101 through the shared contact 210. The shared contact 210 may be long enough to separate the e-fuse and the device 101 with enough space to avoid any interference from the heat emitted when current passes through the e-fuse.

It should be noted in FIG. 10, a gate contact 122 is shown. The gate contact 122 may be formed simultaneously with, at the same level as, and of the same material as, the device contacts 111, the shared contact 210, the first fuse contact 110a, and the second fuse contact 110b from previous embodiments.

FIGS. 11 and 12 are demonstrative illustrations of a structure 300 according to an alternative embodiment. More specifically, the e-fuse structure described above may alternatively be fabricated in one of multiple a back-end-of-line levels located above the MOL. FIG. 12 is a cross section view of FIG. 11 taken along section line A-A.

A third inter-level dielectric 308 (hereinafter "third ILD") and a forth inter-level dielectric 318 (hereinafter "fourth ILD") can be the same material as the first ILD 108 or the second ILD 118. It should be noted that the third ILD 308 and the fourth ILD 318 may be at any level above the substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a first fuse contact in an inter-level dielectric and a second fuse contact in the inter-level dielectric;
    forming a fuse link above the first fuse contact and above the second fuse contact, the fuse link is in electrical connection with the first fuse contact, the fuse link is in electrical connection with the second fuse contact; and
    forming a first metal via above the first fuse contact and in electrical connection with the first fuse contact, the first metal via is separated by a first distance from the fuse link.

2. The method of claim 1, further comprising:
    forming a second metal via above the second fuse contact and in electrical connection with the second fuse contact, the second metal via is separated by a second distance from the fuse link.

3. The method of claim 1, further comprising:
    forming an electrical connection between the first metal via and a device contact.

4. The method of claim 1, wherein forming the second fuse contact comprises:
    forming the second fuse contact above and in electrical contact with a source-drain region of a semiconductor device; and
    forming an electrical connection between the second fuse contact and a device contact.

5. The method of claim 1, wherein the inter-level dielectric layer is a middle-of-line dielectric layer located directly above a substrate.

6. The method of claim 1, wherein the inter-level dielectric layer is a back-end-of-line dielectric layer located in a back-end-of-line region.

7. The method of claim 1, wherein forming the first fuse contact and the second fuse contact in the inter-level dielectric comprises:
forming the first fuse contact and the second fuse contact simultaneously with forming a device contact in the inter-level dielectric, the device contact is in in direct contact with and positioned above a source-drain region of a semiconductor device.

8. A method comprising:
forming a gate on a substrate;
forming a source-drain region on the substrate, wherein the source-drain region is adjacent to the gate;
forming an inter-level dielectric layer above the substrate, above the source-drain region, and above the gate;
forming a device contact, a first fuse contact, and a second fuse contact in the inter-level dielectric layer, the device contact is above the source-drain region and the device contact is in electrical connection with the source-drain region, the device contact is self-aligned to the gate;
forming a fuse link above the first fuse contact and above the second fuse contact, the fuse link is in electrical connection with the first fuse contact and the fuse link is in electrical connection with the second fuse contact; and
forming a first metal via above the first fuse contact, the first metal via is in electrical connection with the first fuse contact, the first metal via is separated by a distance from the fuse link.

9. The method of claim 8, further comprising:
forming a second metal via above the second fuse contact, the second metal via is in electrical connection with the second fuse contact, the second metal via is separated by a distance from the fuse link.

10. The method of claim 8, further comprising:
forming an electrical connection between the first metal via and the device contact.

11. The method of claim 8, wherein forming the device contact, the first fuse contact, and the second fuse contact in the inter-level dielectric layer comprises:
forming the device contact and the second fuse contact as a single shared contact.

12. A structure comprising:
a device contact, a first fuse contact, and a second fuse contact, all on the same level;
a fuse link directly above the first fuse contact and in electrical connection with the first fuse contact, the fuse link is directly above the second fuse contact and in electrical connection with the second fuse contact; and
a first metal via above the first fuse contact and in electrical connection with the first fuse contact, the first metal via is separated by a distance from the fuse link.

13. The structure of claim 12, further comprising:
a second metal via above the second fuse contact and in electrical connection with the second fuse contact, the second metal via is separated by a distance from the fuse link.

14. The structure of claim 12, further comprising:
an electrical connection between the first metal via and the device contact.

15. The structure of claim 12, wherein the second fuse contact and the device contact are a single shared contact, the single shared contact is in direct contact with and positioned above a source-drain region of a semiconductor device.

16. The structure of claim 12, wherein the device contact is in direct contact with and positioned above a source-drain region of a semiconductor device.

* * * * *